United States Patent [19]

Bonnet et al.

[11] Patent Number: 5,304,499
[45] Date of Patent: Apr. 19, 1994

[54] METHODS OF MAKING PN CDTE/CDS THIN FILM SOLAR CELLS

[75] Inventors: Dieter Bonnet, Friedrichsdorf; Beate Henrichs, Eschborn; Karlheinz Jager, Kronberg; Hilmar Richter, Frankfurt am Main, all of Fed. Rep. of Germany

[73] Assignee: Battelle-Institut e.V., Frankfurt am Main, Fed. Rep. of Germany

[21] Appl. No.: 929,514

[22] Filed: Sep. 28, 1992

[30] Foreign Application Priority Data

Oct. 3, 1991 [DE] Fed. Rep. of Germany ....... 4132882

[51] Int. Cl.$^5$ .................. H01L 31/18; H01L 31/072
[52] U.S. Cl. ........................ 437/5; 136/260; 136/264; 437/102; 437/234; 427/76
[58] Field of Search ..................... 437/4-5, 437/81, 87, 103, 139, 234; 427/74, 76; 136/260, 264

[56] References Cited

U.S. PATENT DOCUMENTS

| | | | |
|---|---|---|---|
| 4,207,119 | 6/1980 | Tyan | 136/258 |
| 4,375,644 | 3/1983 | Mori et al. | 257/184 |
| 4,650,921 | 3/1987 | Mitchell | 136/258 |

FOREIGN PATENT DOCUMENTS 0006025 12/1979 European Pat. Off. ............ 136/258

OTHER PUBLICATIONS

K. Mitchell et al, *J. Vac. Sci. Technol.*, vol. 12, No. 4, Jul./Aug. 1975, pp. 909-911.
Y-S Tyan et al, *Conference Record, 16th IEEE Photovoltaic Specialist Conf.*, Sep. 1982, pp. 794-800.
V. Sosa et al, *J. Vac. Sci. Technol.*, vol. A8, Mar./Apr. 1990, pp. 979-983.
T. L. Chu et al, *Solar Cells*, vol. 21, pp. 73-80 (1987).
Y-S. Tyan, *Solar Cells*, vol. 23, pp. 19-29 (1988).
H. Uda et al, *Jap. J. Appl. Phys.*, vol. 29, Oct. 1990, pp. 2003-2007.
D. Bonnet et al, *Conf. Record, 22nd IEEE Photovoltaic Specialists Conf.* (Oct. 1991), pp. 1165-1168.
T. L. Chu, "Thin Film Cadmium Telluride Solar Cells by Two Chemical Vapor Deposition Techinques", *Solar Cells*, 23 (1988), pp. 31-48.
"Thin Film Solar cells", Katsuri Lal Chopr, Suhit Ranjan Das, Plenum Press, New York (1983), pp. 288-290; 295-304; 408-409.

*Primary Examiner*—Aaron Weisstuch
*Attorney, Agent, or Firm*—Lane, Aitken & McCann

[57] ABSTRACT

A method of making pn CdTe/CdS thin film solar cells, in which a transparent TCO layer is deposited as a front contact on a transparent substrate in the form of inexpensive soda-lime glass, and is preferably provided with an ultra-thin indium layer, which is in turn coated with the CdS layer, wherein the thus coated substrate is brought to the CdTe coating at a temperature between 480° C. and 520° C., which is maintained during the ensuing rapid CdTe deposition using the close-spaced sublimation method with a preferred rate of deposition of 5 to 15 μm/min in an inert atmosphere. The indium layer dissolves during this deposition and effects the necessary n-doping of the CdS layer, without an additional method step. Solar cells can be made in this way with high efficiency in an inexpensive method, suitable for mass production.

10 Claims, 2 Drawing Sheets

METHODS OF MAKING PN CDTE/CDS THIN FILM SOLAR CELLS

The present invention relates to methods of making polycrystalline pn CdTe/CdS thin film solar cells and especially such methods which make inexpensive mass production possible.

Because of its favorable energy gap of 1.45 eV, CdTe is ideally suited as photo-active material for solar cells. Moreover, polycrystalline layers of a few $\mu$m thickness can be made by various methods (physical or chemical evaporation/sublimation in a vacuum, electrolytic deposition, screen printing, spray methods), which in general are subjected to a chemical-thermal post-treatment to improve their electronic properties (R. W. Birkmire et al, Proc. Polycrystalline Thin Film Program Meeting, Lakewood, Colo., USA, (1989) pp. 77-84). These two characteristics make CdTe one of the most interesting candidates for inexpensive thin film solar cells.

CdTe came into use in thin film solar cells for the first time around 1960. At the end of the 70's efficiencies for such solar cells of around 9% were reported. For example, U.S. Pat. No. 4,207,119 (Yuan-Sheng Tyan, 1980) describes a CdS/CdTe solar cell with oxygen as the dopant in both semiconductor layers CdS and CdTe of the cells. There is a disadvantage in the use of oxygen during the manufacture of the layers, since oxidation of the CdTe source can occur easily at too high an oxygen concentration in the deposition chamber, whereby the process of deposition is adversely affected or even interrupted. Moreover, the temperature of the substrate on which the polycrystalline CdTe layer was deposited is at least 575° C. and expensive temperature resistant glass substrates are used (with softening temperatures of 650° to 700° C.). Below a substrate temperature of 575° C. a significant fall-off in the attainable efficiency is observed. Thus, the CdTe layer was deposited experimentally at low temperatures in an atmosphere containing oxygen down to 500° C., when, however, an efficiency of less than 4% resulted. The possibility of increasing the efficiency by 1 to 2% by additional subsequent oxygen post-treatment was also proposed, whereby only values of 6% maximum resulted at 500° C. Attempts were also made to deposit the CdS layer free from oxygen, in contrast to the CdTe layer. The attempts showed, however, that the CdS layer also had to be deposited in an atmosphere containing oxygen, in order to be able to attain an efficiency of up to 8.9% at substrate temperatures above 575° C. In the experiments performed, CdTe layers 0.5 $\mu$m thick were deposited in 2 min. With a minimum thickness of around 2 to 3 $\mu$m needed for physical reasons, approximately 10 min. is already needed for the deposition.

In U.S. Pat. No. 4,650,921 (Kim W. Mitchell, 1987) there is described a pn CdTe/SnO$_2$ thin film solar cell, in which the polycrystalline CdTe layer is also deposited at high substrate temperatures (600°-650° C.), whereby the usual expensive temperature resistant glass substrates are also used. The CdTe source is first heated to 600° C. and, on attaining this temperature, the substrate previously heated to 450° C. is rapidly heated up to 650° C. The CdTe deposition rates to obtain a CdTe layer about 10 $\mu$m thick in the CSVT (closed space vapor transport) methods are very small, and deposition must take place for approximately 20 minutes.

As well as these vacuum-assisted deposition methods, electrolytic methods were described in the 80's (e.g. B. M. Basol, Solar Cells, 23, (1988) pp. 69-88; V. Ramanathan et al. Proc. 20th IEEE Photovoltaic Specialists Conf., Las Vegas, (1988) pp. 1417-1421), as well as screen printing (e.g., S. Ikegami, Solar Cells, 23, (1988) pp. 89-105) or spray methods (e.g. J. F. Jordan, Solar Cells, 23, (1988) pp. 107-113), for making polycrystalline CdTe layers.

The electrolytic deposition takes place in an aqueous solution of CdSO$_4$ and Te$_2$O$_3$ at temperatures of about 90° C. In order to avoid fluctuations in the stoichiometric composition of the growing CdTe layer, it is necessary to adhere to very small and hence uneconomic rates of deposition of only about 1 $\mu$m/hour.

In the screen printing method, suspensions of Cd and Te powders are applied to a substrate and sintered with high usage of material into relatively thick layers of around 30 $\mu$m, whereby Cd and Te react to form CdTe. High temperatures of more than 700° C. are also required here, which necessitates the use of expensive substrates.

In the spray method, an aqueous solution of compounds containing Cd and Te in the form of a fine droplet aerosol is sprayed onto a substrate heated to about 400° C. The growing CdTe layer is markedly inclined to porosity, so that relatively thick layers have to be made in order to ensure the necessary impermeability of the layers. An uneconomic high usage of materials is again involved. Furthermore, a significant loss of the sprayed solution is inherent in the method, in that this fills the whole reaction chamber as a fine aerosol and is lost on the walls and through the exhaust air, whereby only a moderate material yield of the compounds of the Cd and Te compounds can be achieved. The chemical-thermal post treatment proves to be particularly critical in the spray method.

The invention is thus based on the problem of providing an improved method for making pn CdTe thin film solar cells which is especially suitable for inexpensive mass production and makes the production of satisfactory solar cells possible.

The solution to this problem according to the invention involves a complete departure from the high substrate temperatures hitherto regarded as necessary in order to be able to make solar cells with efficiencies around and above all in excess of 10%. Thus, the inventor has surprisingly ascertained that it is possible to make satisfactory solar cells with high efficiency if care is taken that the temperature of the transparent substrate provided with the TCO layer and the CdS layer is brought to a temperature below about 520° C. and above about 480° C. before the CdTe coating and this temperature is maintained also during the following coating. During this time the CdTe layer is deposited steadily in an inert gas atmosphere. In the oxygen-free processes in the state of the art, substrate temperatures of 600° C. and more were universally employed.

It has furthermore been found that inexpensive soda-lime glass (window glass) can be used as the substrate material and resulted in solar cells with a high efficiency of more than 10% in all embodiments tested. This represents a significant technical advance, since the substantial reduction in cost widens the scope for use of the mass-produced product. Hitherto, it has not been considered or even thought possible for solar cells of this kind to be made with window glass and be not merely functional but seriously capable of use.

Furthermore, it has been found that, with such temperature control of the substrate, it is possible to work with a high CdTe deposition rate of between 5 and 15 μm/min, so that the growth of the CdTe layer takes place from the very start at a temperature favoring the attainment of the required (photo)electronic characteristics, so that a good efficiency of the cells is likewise obtainable. Such high rates of deposition have not been possible hitherto, either in oxygen or in inert gases.

Preferably, one proceeds in accordance with the invention as follows. Inexpensive, ordinary soda-lime glass ("window glass") is used as the transparent substrate and is coated with a transparent, electrically conductive TCO (transparent conducting oxide) layer. This consists, for example, of a suitably doped tin oxide layer, for example of ITO or a modified ITO layer. The TCO layer also forms the electrical front contact of the solar cell. A thin CdS layer (thickness approximately 80 to 120 nm, preferably 100 nm) is then evaporated on in a high vacuum, with doping preferably achieved in the manner indicated below.

The deposition of the photo-active CdTe layer then takes place directly on the CdS layer, according to the close-space (CSS) method (close-spaced sublimation). The substrate carrying the CdS layer is brought for this to a temperature, of 480° to 520° C., preferably 500° C., in a steady heating process, preferably in approximately 3 min. The TCO layer suffers no adverse effects in the course of this short heating phase, since it is protected by the CdS layer. During this time the CdTe source attains a temperature at which as yet no appreciable sublimation of the CdTe takes place. Only when the substrate temperature has reached (after e.g. the 3 minutes) 480° to 520° C., preferably 500° C., is the CdTe source brought in approximately 1 minute to such a temperature (e.g., in the range from 700° to about 770° C., preferably about 740° C.), that a CdTe deposition rate of 5 to 15 μm/min., preferably about 10 μm/min., is attained, so that the required CdTe layer 5 to 10 μm thick can be created in the short time of approximately 1 minute.

During the CdTe deposition a pressure of about 0.1 mbar nitrogen (or similar inert gases such as helium, argon or hydrogen) is preferably so maintained in the reaction chamber (quartz tube) that the same amount of gas is fed in as is pumped out, in the nature of a dynamic balance through the various connections of the reaction chamber.

The CdTe source from which the material to be deposited on the CdS layer sublimes is preferably located at a small distance of only about 2 to 3 mm from the substrate surface. On account of the small distance between the substrate and the CdTe source, as well as their direct opposition, there is nearly 100% usage of the CdTe starting material. Furthermore, the small thickness of the CdTe layer possible according to the invention contributes to inexpensive handling of the valuable semiconductor material. The short deposition time also acts inexpensively in the course of this method.

During the described operation of the CdTe deposition, the substrate and CdTe source are preferably held in opposed graphite blocks, which are heated by heating elements (e.g. halogen lamps), in order to create the required temperatures. The latter are adjusted by suitable manual or computer-controlled regulation of the heating load of the heating element. The $CdCl_2$ tempering which is carried out at the end of the CdTe deposition is known per se.

The further development of the method in accordance with the present invention contributes significantly to mass-production, in that the method of doping of the CdS layer is substantially facilitated. It is also possible to increase the efficiency of the finished solar cell by this measure.

Finally, in contrast to the known critical oxygen doping, it is possible to operate without endangering the CdTe source by oxidation during the CdTe coating at high pressure.

It is beneficial for obtaining a good efficiency of the pn CdTe/CdS thin film solar cell to use an n-type CdS with high conductivity, of the order of magnitude of 0.1 S/cm. While a CdS layer made at about 150° C. fulfills this condition well, a CdS layer subjected to a thermal process, as in the CdTe deposition, only exhibits a very small conductivity of $<10^{-5}$ S/cm. In order to obtain a desirable order of magnitude of 0.1 S/cm for the conductivity of the CdS even after the thermal stress of the CdTe deposition, an ultra-thin indium layer with a thickness of approximately 0.1 to 0.5 nm, preferably 0.2 nm, is applied in a high vacuum to the TCO layer at approximately 25° C., before the CdS layer is applied preferably in the manner given above. The thickness of the indium layer is so selected that the diffusion of the indium into the CdS layer during the CdTe deposition at the predetermined substrate temperature, which preferably lies between 480° and 520° C., creates such n-type doping in the CdS that the conductivity value stays in the required order of magnitude of 0.1 S/cm. The required and desirable n-type doping of the CdS layer is thus effected inexpensively without additional expense during the CdTe deposition. It should further be noted that, even without the indium doping of the CdS layer, efficiencies of around and in excess of 10% are obtained.

After the customary $CdCl_2$ tempering (R. W. Birkmire et al., Proc. Polycrystalline Thin Film Program Meeting, Lakewood, Colo., USA, (1989) pp. 77–84), a gold layer approximately 5 to 10 μm thick is evaporated onto the CdTe layer as the back contact. In order to avoid series resistance, the gold layer preferably has an evaporated inexpensive metal layer (e.g. aluminum) (about 100–200 nm) or is painted with a conductive paste and so brought up to the conductivity necessary for the flow of the photocurrent.

The illumination of the solar cell takes place through the transparent glass substrate.

The features of the special doping of the CdS layer according to the invention are preferably combined with the other features according to the invention. Thus, with the substrate temperatures controlled in accordance with the invention, the mixing of the CdS layer and the indium layer can be well achieved. In combination with the likewise possible high rate of deposition, the efficiency of the method and its suitability for mass production are further improved.

The features according to the invention, taken alone and in their combination, thus promote inexpensive mass production of pn CdTe/CdS thin film solar cells with a type of construction previously known. Inexpensive substrate materials can be used and high yields of the expensive substrate materials with high rates of deposition for the semiconductor layers are possible. The doping step which was previously frequently critical is markedly improved and rationalized. In addition, the features referred to contribute to high efficiency. The inventive features thus contribute an important step towards an alternative energy source through solar cells, which arises both from the mass production and from a high efficiency.

BRIEF DESCRIPTION OF THE DRAWINGS

The invention will be further explained below with reference to the drawings, in which:

FIG. 1 shows a schematic section through a pn CdTe/CdS thin film solar cell 1, which has been made by a preferred embodiment of the method according to the invention. The transparent substrate 20 consists of soda-lime glass ("window glass") and is coated with a transparent, electrically conductive TCO layer 18. There follow an ultra-thin indium layer 16 and a CdS layer 14 (e.g. 0.10 $\mu$m thick). The photo-active CdTe layer 12 (preferably around 5 $\mu$m thick but not critical in thickness for the cell as a whole so long as it stays above 2 to 3 $\mu$m) is deposited on the CdS layer according to the foregoing techniques. As has further been indicated, the layers 16 and 14 mix so tht the indium layer 16 dissolves in the layer 14 because of the diffusion of the indium atoms and is no longer identifiable as such in the finished solar cell 1. The CdS layer thus contains the indium atoms of the indium layer 16 in dispersed form after manufacture, as the desired and necessary n-type doping.

Figure 1:
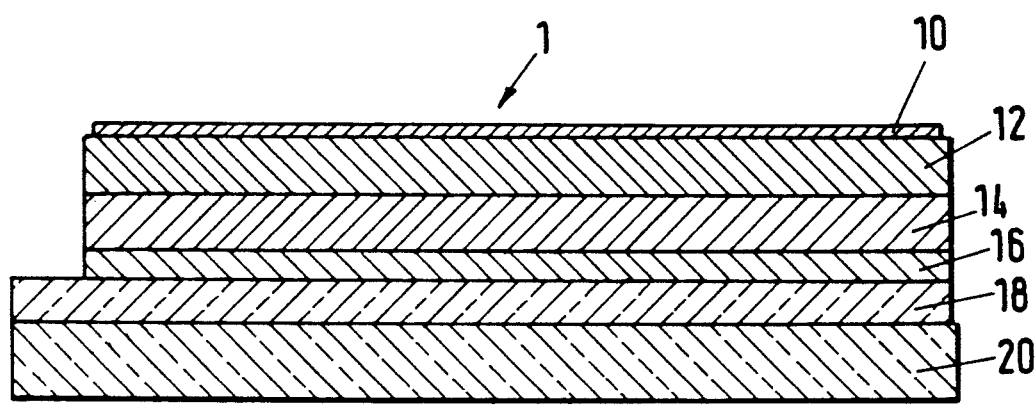
FIG. 1 shows a section, in a schematic view, through a pn CdTe/CdS thin film solar cell made according to a preferred embodiment of the method according to the invention.

This n-type doping of the CdS layer taking place at the same time as the deposition of the CdTe layer 12 represents a further advance both in relation to improving the suitability of the method to inexpensive mass production, as well as to the creation of a solar cell with high efficiency. The indium layer 16, preferably 0.1 to 0.5 nm thick and preferably evaporated in a high vacuum at about 25° C., is therefore only identifiable as such up to the method step preceding the CdTe deposition.

After completion of the CdTe deposition, there follows after the CdCl$_2$ tempering the application of an electrically conductive metal contact 10 on the CdTe layer 12, serving as the back contact of the solar cell 1. The TCO layer 18 functions as the front contact of the solar cell 1. The illumination of the solar cell 1 takes place through the glass substrate 20 and the TCO layer 18.

Figure 2:
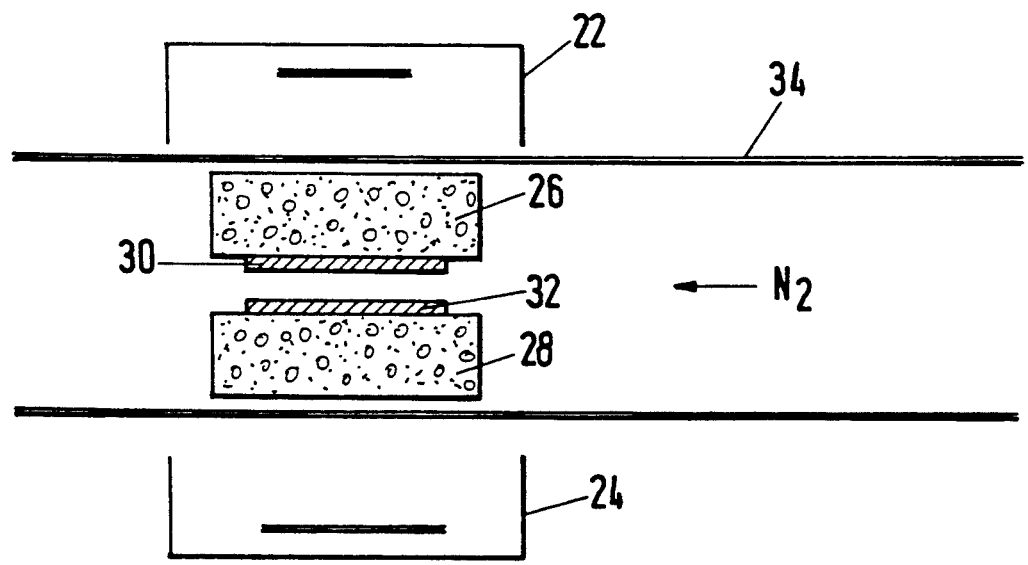
FIG. 2 shows a section, in a schematic view, through an apparatus suitable for carrying out the method according to the invention.

The CdTe deposition method is also especially important. In FIG. 2 there is shown a reaction chamber which is preferably used, likewise in schematic cross-section. This consists of a quartz reactor 34 and graphite blocks 26 and 28, as well as heating elements 22 and 24 (e.g. halogen lamps), with which the graphite blocks 26 and 28 are heated. The glass substrate 20 with the TCO layer 18 as well as the indium layer 16 and the CdS layer 14, shown as element 30 in FIG. 2, is so attached to the upper graphite block 26 that the glass substrate lies against the graphite block 26 and the CdS layer 24 is directed towards the CdTe source. The CdTe source 32, e.g. in the form of a polycrystalline disc, is located on the lower graphite block 28. Instead of a polycrystalline disc, a pressed blank of CdTe powder or a device with CdTe powder can obviously be used as the CdTe source 32.

The CdTe deposition is effected in the reaction chamber 33 according to a procedure in which, as already particularly explained above, it is crucial that the variation with time of the temperature of the element 30 and of the CdTe source 32 is such that the element 30 including the CdS layer is brought up to a temperature of 480°-520° C., preferably 500° C., in a steady heating process (without interruption) in e.g., 3 min., whereby the TCO layer 18 does not suffer any adverse effects in the course of this short heating phase, since it is protected by the CdS layer 24. During this time the CdTe source 32 reaches a temperature at which as yet no appreciable sublimation of the CdTe takes place. Only when the temperature of the element 30 has reached 480°-520° C., preferably 500° C., is the CdTe source 32 brought up in about 1 min. to such a temperature that a CdTe deposition rate onto the CdS layer 14 of 5 to 15 $\mu$m/min, preferably about 10 $\mu$m/min, is obtained and the required CdTe layer 12 of 5 to 10 $\mu$m thickness can be created in the short time of about 1 minute. This procedure results in the growth of the CdTe layer 12 taking place from the start at a temperature favoring the required (photo) electronic characteristics. The temperature of the element 30 is so selected that cheap soda-lime glass can be used as the material for the substrate 20. The pressure in the reaction chamber 34 amounts during the CdTe deposition to about 0.1 mbar and is maintained by inflow or pumping out nitrogen (or helium, argon or hydrogen).

The heating load of the heating elements 22 and 24 can be optionally varied manually or by computer control.

Figure 3:
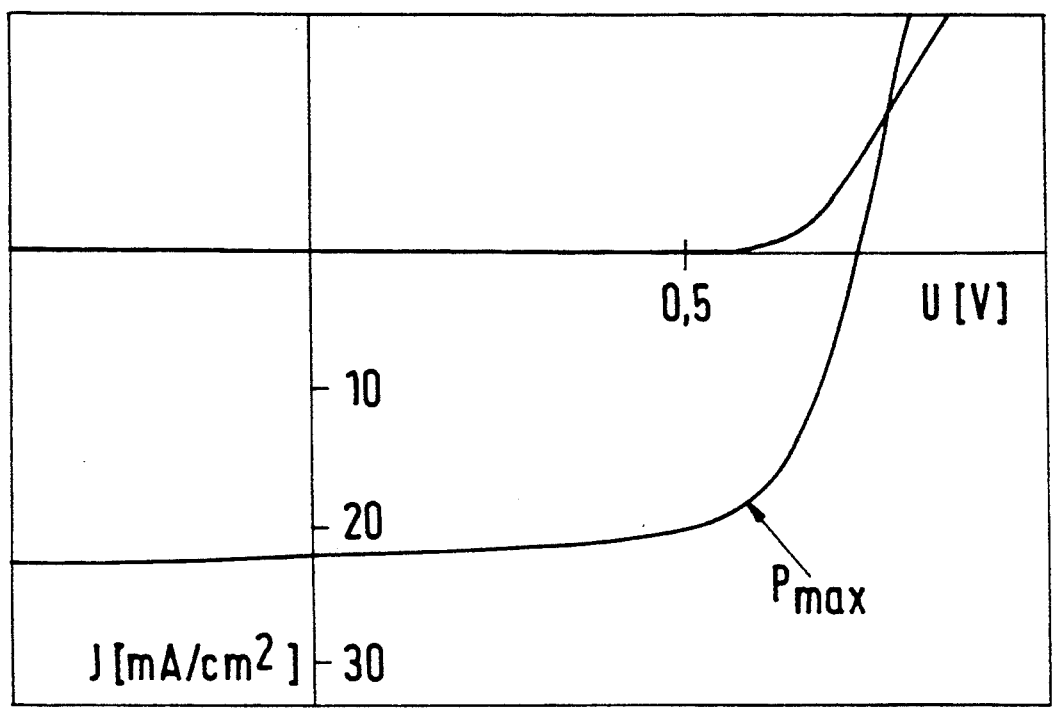
FIG. 3 shows the current/voltage characteristic of a pn CdTe/CdS thin film solar cell made according to the method explained with reference to FIG. 1.
Figure 4:
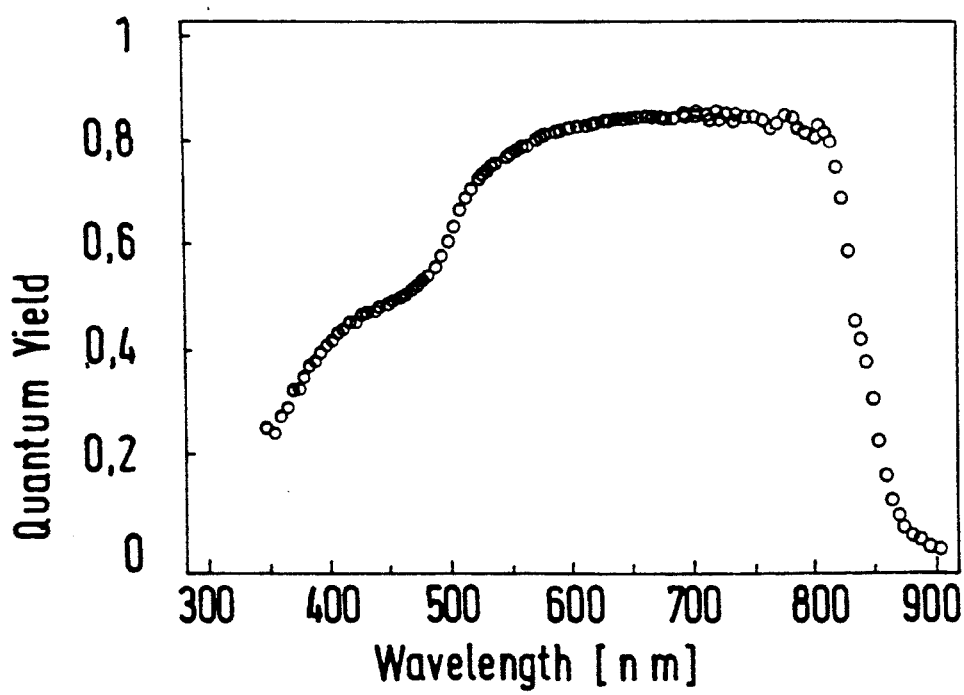
FIG. 4 shows the graph of the (external) absolute quantum yield as a function of wavelength of a pn CdTe/CdS thin film solar cell made according to the method explained with reference to FIG. 1.

In FIGS. 3 and 4 there are shown the current/voltage characteristic and the (external) absolute quantum yield as a function of the wavelength respectively of a pn CdTe/CdS thin film solar cell made in accordance with the above method. As can be seen from FIG. 3, the short-circuit current density of the manufactured solar cell amounts to 22.8 mA/cm$^2$ with a no-load voltage of 0.750 V and a space factor of 65%. The active surface of the solar cell of the embodiment set forth amounts to 0.388 cm$^2$. This gives an efficiency of 11.0% (relative to illumination with 100 mW/cm$^2$, 1.5 AM overall).

The (external) absolute quantum yield according to FIG. 4 exhibits a constant value over the substantial part of the spectrum (about 820–520 nm) with a value around 85%. The fall off at 520 $\mu$m is caused by the absorption of the CdS layer 14.

We claim:
1. A method of making a pn CdTe/CdS thin film solar cell, in which a transparent substrate is provided with a transparent, electrically conducting TCO layer and an n-doped CdS layer, on which a CdTe layer is deposited in an inert atmosphere free of oxygen according to the close-spaced sublimation method from a CdTe source and is provided with an electrically conducting back contact, characterized in that, a substrate of soda-lime glass is used, the substrate is provided with the TCO layer, and the CdS layer is brought to a temperature between approximately 480° C. and 520° C. before coating with the CdTe layer, said temperature being maintained during the CdTe coating.

2. A method according to claim 1, characterized in that a CdCl$_2$ tempering step is employed after the CdTe coating.

3. A method according to claim 1, characterized in that the substrate with the TCO layer and the CdS layer is brought to a temperature of about 500° C. before the CdTe coating, which temperature is maintained during the CdTe coating.

4. A method according to claim 1, characterized in that the heating of the substrate provided with the TCO layer and the CdS layer is effected in a steady heating process over between approximately 1 and 5 min.

5. A method according to claim 4, characterized in that the heating is effected in approximately 3 min.

6. A method according to claim 1, characterized in that the deposition rate of the CdTe on the CdS layer is approximately 5 to 15 μm/min.

7. A method according to claim 6, characterized in that the CdTe layer is deposited in approximately 1 min.

8. A method according to claim 6, characterized in that the CdTe deposition rate is adjusted to 10 μm/min.

9. A method according to claim 1, characterized in that the variation with time of the temperature of the substrate provided with the TCO layer and the CdS layer and of the CdTe source is so controlled that the substrate is brought in a steady heating process to a temperature of 480° to 520° C. in approximately 1 to 5 min. and, during this time, the CdTe source is brought to a temperature at which there is no appreciable sublimation of the CdTe, and in that, only when the temperature of the substrate with the TCO and CdS layers has attained the desired temperature between 480° and 520° C., the CdTe source is brought in approximately 1 min. to a temperature at which a deposition rate on to the CdS layer is obtained such that the required CdTe layer can be applied in approximately 1 min.

10. A method of making a pn CdTe/CdS thin film solar cell, in which a transparent substrate is provided with a transparent, electrically conducting TCO front contact layer and an overlying n-doped CdS layer, on which a CdTe layer is deposited in an inert atmosphere according to the close-spaced sublimation method and is provided with an electrically conducting back contact, characterized in that indium is used for the n-doping of the CdS layer and in that, before the deposition of the CdS layer, an ultra-thin indium layer less than 0.5 nm thick is applied to the TCO layer and in that the In and CdS layers so mix during the deposition of the CdTe layer that the indium layer is dissolved by diffusion of the indium atoms into the CdS layer and is no longer identifiable as such in the finished solar cell and the CdS layer includes the indium atoms of the indium layer in dispersed form as n-doping.

* * * * *